United States Patent
Bailey, III et al.

(10) Patent No.: US 6,723,574 B1
(45) Date of Patent: Apr. 20, 2004

(54) METHOD FOR QUANTIFYING UNIFORMITY PATTERNS AND INCLUDING EXPERT KNOWLEDGE FOR TOOL DEVELOPMENT AND CONTROL

(75) Inventors: Andrew D. Bailey, III, Pleasanton, CA (US); Puneet Yadav, Fremont, CA (US); Pratik Misra, Houston, TX (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/328,876

(22) Filed: Dec. 23, 2002

Related U.S. Application Data
(60) Provisional application No. 60/414,021, filed on Sep. 26, 2002.

(51) Int. Cl.[7] .......................... G01R 31/26; H01L 21/66; G01B 5/28; G01B 5/30; G06F 19/00

(52) U.S. Cl. ......................... 438/16; 438/14; 438/800; 438/10; 702/40; 702/58; 702/81

(58) Field of Search ............................. 438/16, 14–15, 438/17–18, 5–13; 702/33–40, 57–62, 81–84

(56) References Cited

U.S. PATENT DOCUMENTS
6,238,937 B1 * 5/2001 Toprac et al. .................. 438/9
6,649,075 B1 * 11/2003 Buie et al. ..................... 216/59

OTHER PUBLICATIONS
Sach et a. "Automated On-line Optimization of an Epitaxial Process" 1990 Int'l Manf. Science Symp. pp. 92–97.*
N.R. Draper, H. Smith, "Applied Regression Analysis", John Wiley & Sons.
Michael Nikolaou, Andrew D. Bailey, III, "Application of Reduced-Rank Multivariate Methods To The Monitoring Of Spatial Uniformity Of Wafer Etching".

* cited by examiner

Primary Examiner—Craig A. Thompson
(74) Attorney, Agent, or Firm—Martine & Penilla, LLP (57) ABSTRACT

A system and method of for determining multiple uniformity metrics of a semiconductor wafer manufacturing process includes collecting a quantity across each one of a group of semiconductor wafers. The collected quantity data is scaled and a principal component analysis (PCA) is performed on the collected, scaled quantity data to produce a first set of metrics for the first group of semiconductor wafers. The first set of metrics including a first loads matrix and a first scores matrix.

24 Claims, 11 Drawing Sheets

METHOD FOR QUANTIFYING UNIFORMITY PATTERNS AND INCLUDING EXPERT KNOWLEDGE FOR TOOL DEVELOPMENT AND CONTROL

CROSS REFERENCE TO RELATED APPLICATIONS

This application claims priority from U.S. Provisional Patent Application No. 60/414,021 filed on Sep. 26, 2002 and entitled "Method for Quantifying Uniformity Patterns and Including Expert Knowledge for Tool Development and Control," which is incorporated herein by reference in its entirety.

BACKGROUND OF THE INVENTION

1. Field of the Invention

The present invention relates generally to methods and systems of quantifying uniformity of measured quantities on semiconductor wafers, and more particularly, to improved methods and systems for characterizing and analyzing nonuniformities on semiconductor wafers and providing feedback and control to preceding semiconductor manufacturing processes.

2. Description of the Related Art

Semiconductor wafers undergo numerous processes during the semiconductor manufacturing process. Layers may be added, patterned, etched, removed, polished and many other processes. After each process the wafer is typically examined to confirm the previous process was completed with an acceptable level of errors or nonuniformities. The various operating variables (e.g., event timing, gas pressure, concentrations, temperatures, etc.) of each process the wafer is processed through are recorded so that any changes in any variable may be quickly identified and potentially correlated to any errors or nonuniformities discovered when the wafer is examined.

Figure 1A:
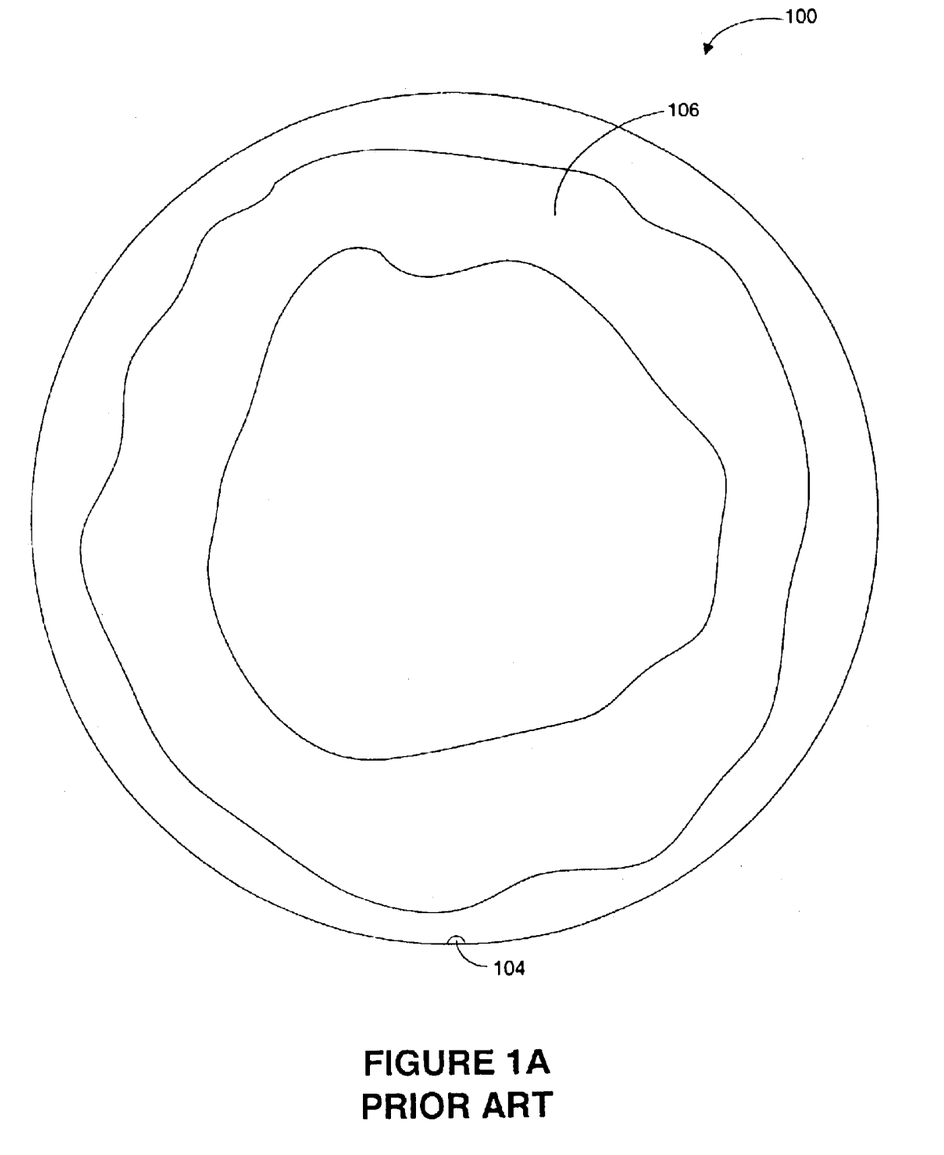
FIG. 1A shows a typical etched wafer.

FIG. 1A shows a typical etched wafer 100. A top layer of material was mostly removed from the wafer in the etch process except for a portion 106 of the top layer. For clarity purposes, the portion 106 is a portion of a layer or ultrathin film. A notch 104 is typically included in each wafer 100 so that the wafer can be oriented (aligned) in the same position during the various manufacturing processes. The portion 106 is a nonuniform portion of the surface of the wafer 100 and therefore can be termed a nonuniformity. As shown, the portion 106 is in the approximate form of a ring or annular shape where the top layer was removed from the center and around the edges of the wafer 100.

Figure 1B:
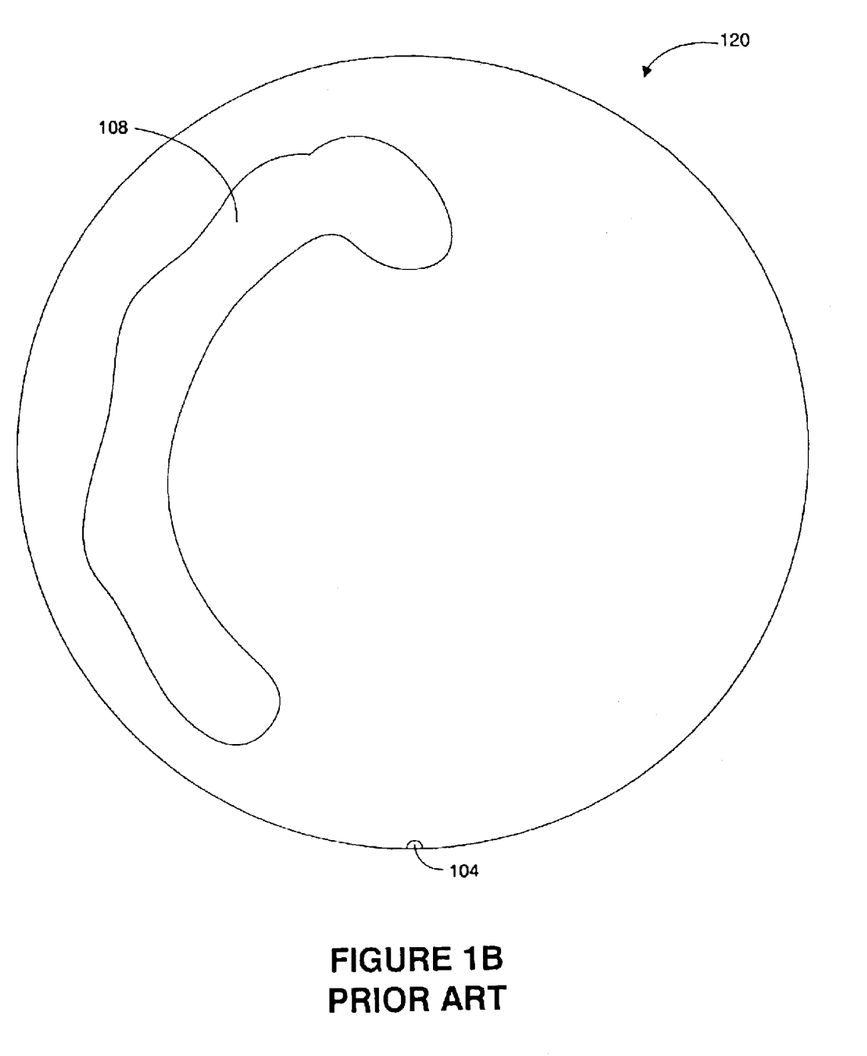
FIG. 1B shows another typical etched wafer.

FIG. 1B shows another typical etched wafer 120. A portion 108 of a top layer remains, when the top layer was mostly removed in the etch process. The portion 108 is typically termed an azimuthal-type nonuniformity on the surface of wafer 120 because the nonuniformity 108 is not the same at the same radius around the wafer 120.

Prior art approaches to describing nonuniformities 106, 108 include subjective, verbal descriptions such as "center-fast" for annular nonuniformity 106 or "left side slow" for azimuthal nonuniformity 108. Center-fast generally describes wafer 100 because material from the center of the wafer 100 is removed faster than the material in the annular region 106. However, center-fast does not provide a specific, objective and quantitative description of the nonuniformity 106. Similarly, left side slow describes wafer 120 because the etch process removed material from the left side region 108 slower than the other regions of the wafer 120 but left side slow also fails to provide a specific, objective and quantitative description of the nonuniformity 108.

The descriptions of the nonuniformities 106, 108 are used to provide feedback to correct errors and inconsistencies in the etch and other preceding processes that were performed on the wafers 100, 120. The descriptions of the nonuniformities 106, 108 can also be used to track the impact of the nonuniformities 106, 108 on subsequent semiconductor manufacturing process and on metrics from completed semiconductor devices (e.g., device yields, performance parameters, etc.)

Figure 1C:
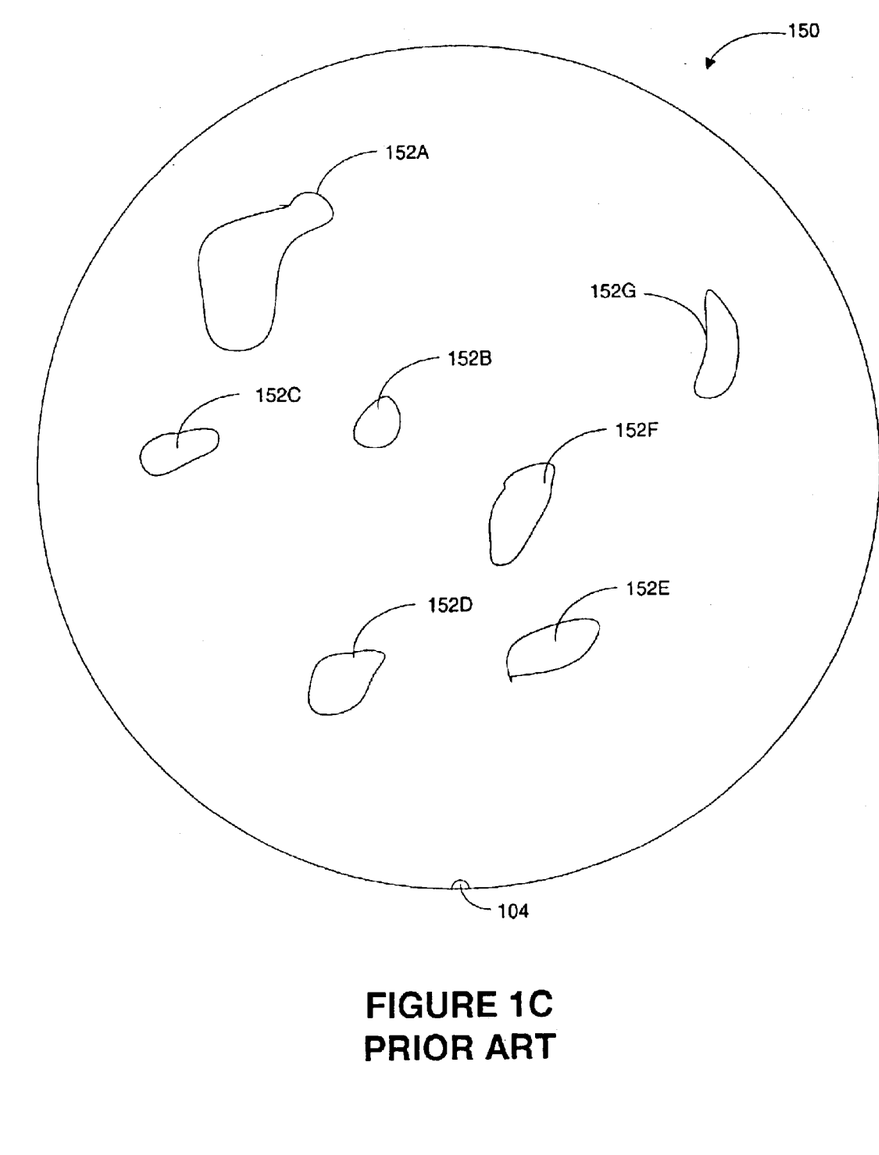
FIG. 1C shows a typical wafer with multiple, asymmetrical nonuniformities.

As nonuniformities become smaller and smaller, the nonuniformities become less symmetrical and also more difficult to accurately describe with the subjective, verbal descriptions. FIG. 1C shows a typical wafer 150 with multiple, asymmetrical nonuniformities 152A–G. The nonuniformities 152A–G can be smaller and are less symmetrical than nonuniformities 106, 108 in part because the various variables in the etch and other previous processes are very stringently controlled. The subjective, verbal descriptions have therefore become insufficient to accurately describe the nonuniformities 152A–G so that further improvements in the preceding processes can be successfully completed.

Figure 1D:
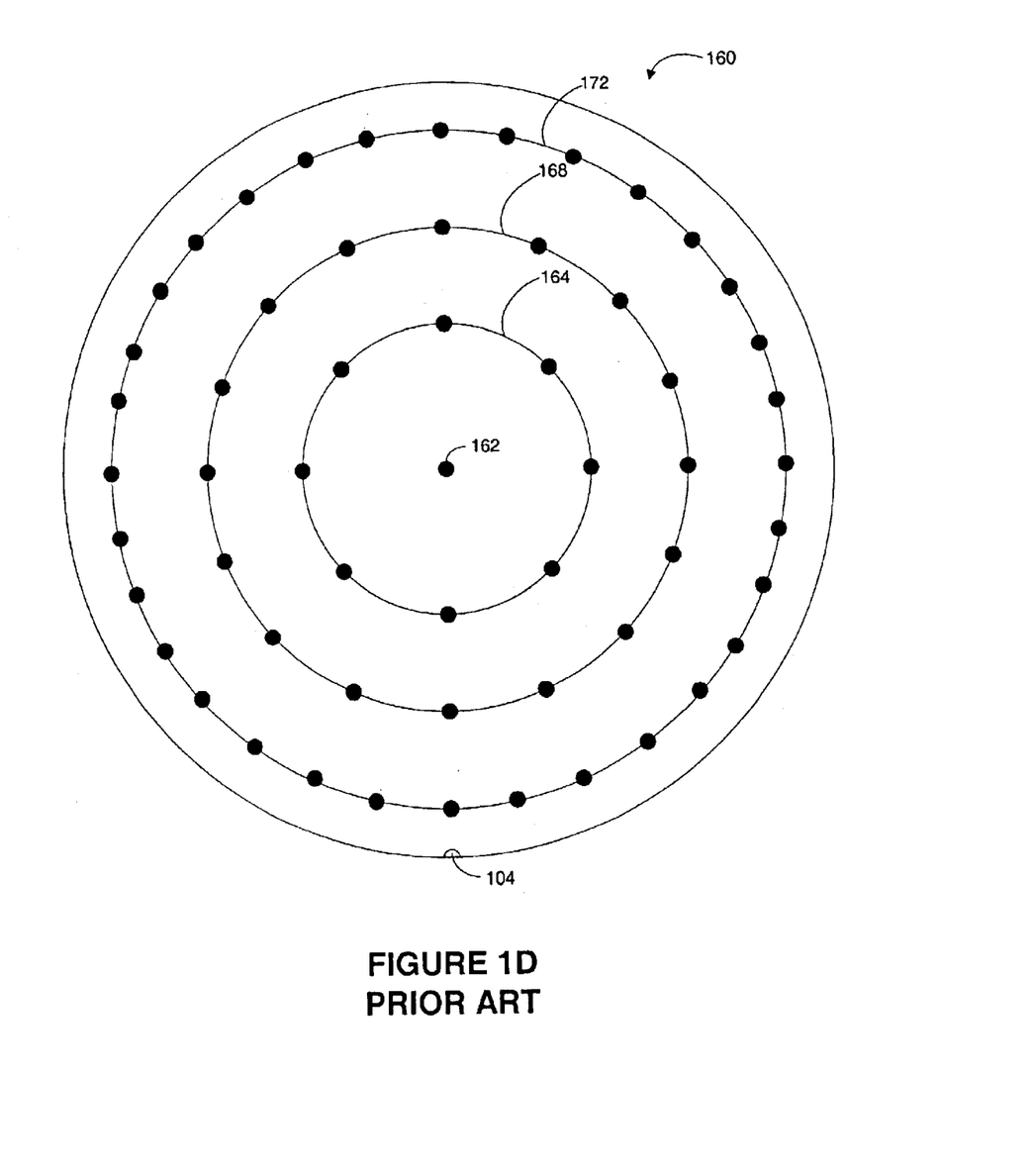
FIG. 1D shows a typical 49-point array used in completing an azimuthal scan of wafer.

A more objective description of wafer uniformity is referred to as a 3-sigma uniformity metric. The 3-sigma uniformity metric quantifies a standard deviation of measurements of some quantity of the wafer. By way of example, the 3-sigma can be an expression of the deviations in thickness of the wafer detected by an array of measurement points across the wafer. FIG. 1D shows a typical 49-point array used in completing a scan of wafer 160. The thickness of the wafer 160 is measured at each of the 49 points. The 49-points are arranged with a center point 162, and three concentric rings 164, 168, 172. The inner ring 164 has 8 evenly spaced points. The intermediate ring 168 has 16 evenly spaced points. The outer ring 172 has 24 evenly spaced points. The rings 164, 168, 172 are typically approximately equally spaced radially from the center point 162. Each of the points in the rings 164, 168, 172 and the center point 162 is typically assigned to represent a given portion of the wafer 160. For example, a typical wafer 160 has a 3 mm edge exclusion zone on the outer perimeter of the wafer 160. The rings 164, 168, 172 and the center point 162 are spaced equidistant and therefore each of the 49 points represent about $1/49^{th}$ of the area of the wafer 160, less the 3 mm exclusion zone (i.e., the outer edge of the wafer where expected process abnormalities occur). Because nonuniformities do not suddenly appear under a single scan point, the nonuniformities are automatically smoothed due to the choice of measuring points.

The measured thicknesses can be correlated to other aspects of the wafer such as an etch rate at the particular measured point A standard deviation (SD) and mean of the etch rates at these 49 points are determined. The 3-sigma nonuniformity metric equal to $[3*(SD)/mean]/100$, expressed as percentage is typically reported. The 3-sigma metric effectively compresses or summarizes all of the individually measured point etch rates to one summary value. However, the 3-sigma metric does not provide any information about the relationship between the etch rates at the different measured points. This relationship can become important when higher uniformity is achieved. The relationship can help identify differences between different etch patterns with the same 3-signal nonuniformity metric.

Many prior art approaches apply a Fourier or a Bessel decomposition on the measured data to better describe a shape and magnitude of the nonuniformity 106, 108, 152A–G. However, Fourier and Bessel decompositions are an effort to force-fit the shape of the nonuniformity to a predetermined Fourier and Bessel defined shape, rather than determine the actual shape of the nonuniformity 106, 108, 152A–G. The Fourier and Bessel decompositions are therefore only estimating the magnitude of the nonuniformity in the forced-fit shape. While the Fourier and Bessel decompositions provide additional objective descriptions of the nonuniformities, the Fourier and Bessel decompositions still do not accurately describe either the shape or the magnitude of the nonuniformity 106, 108, 152A–G.

In view of the foregoing, there is a need for an improved system and method of objectively and accurately quantifying a nonuniformity and correlating the nonuniformity to a any relevant change in the system (for e.g. process variable, hardware change).

SUMMARY OF THE INVENTION

Broadly speaking, the present invention fills these needs by providing a system and method for quantifying a nonuniformity and correlating the nonuniformity to process variables. It should be appreciated that the present invention can be implemented in numerous ways, including as a process, an apparatus, a system, computer readable media, or a device. Several inventive embodiments of the present invention are described below.

One embodiment includes a method for determining a multiple uniformity metrics of a semiconductor wafer manufacturing process includes collecting a quantity across each one of a group of semiconductor wafers. The collected quantity data is scaled and a principal component analysis (PCA) is performed on the collected, scaled quantity data to produce a first set of metrics for the first group of semiconductor wafers. The first set of metrics including a first loads matrix and a first scores matrix.

Collecting the quantity across each one of the first group of semiconductor wafers can include measuring a quantity at several locations on each one of the first group of semiconductor wafers and storing the measured quantity values in a matrix of the first group of semiconductor wafers and the locations.

Scaling the collected quantity data can include subtracting a pre-selected value from the measured quantity values. Scaling the collected quantity data can also include subtracting a mean value of the measured quantity values for a selected wafer from the measured quantity values of the selected wafer.

The first loads matrix can include a first set of principal components present in the collected, scaled quantity data. The first scores matrix can include a first set of scores. Each of the first set of scores provides information relating a contribution magnitude for each of the principal components.

The method can also include determining a first subset of significant loads from the first set of loads.

Determining the first subset of significant loads from the first set of loads can include providing a noise level of semiconductor wafer manufacturing process and a confidence level. A confidence factor that correlates to the confidence level is determined. A significant level of scores equal to a product of the confidence factor and the noise level is calculated. The significant level of scores correspond to a significant number of components. The first subset of significant loads are identified as the loads from the first set of loads that have the significant number of components.

Alternatively, determining the first subset of significant scores from the first set of loads includes generating a noise vector and determining a set of projected noise scores. The set of projected noise scores are recorded. A multiple of projected noise iterations is selected and performed. A mean and standard deviation of the projected scores is determined. The standard deviation of the projected scores is stored and a subsequent noise level is selected. A multiple of subsequent noise level iterations is selected and performed. A standard deviation of the noise level is calculated and graphed. A confidence factor that correlates to the confidence level is calculated. The significant level of scores correspond to a significant number of components. The first subset of significant loads are identified as the loads from the first set of loads that have the significant number of components.

A selected process variable can be changed and a quantity data for a second group of semiconductor wafers are collected. The collected quantity data for the second group of semiconductor wafers can be scaled. The second set of scaled data can be projected on the first subset of significant loads to identify a set of projected scores. The second set of projected scores can be analyzed.

Analyzing the second set of projected scores can include correlating the selected process variable with the second set of projected scores.

Analyzing the second set of projected scores can also include identifying a set of difference components included in the second set of projected scores that are not included in the first set of projected scores. The set of difference components can include one or more new components.

Correlating the selected process variable with the plurality of projected scores can include performing partial least squares (PLS).

The first loads matrix can be an orthonormal matrix. The first scores matrix can be an orthogonal matrix. The quantity data can include etch rate data.

Substantially all of the process variables in the semiconductor wafer manufacturing process are substantially, constant during a processing of the first group of semiconductor wafers.

Another embodiment includes a method for determining uniformity metrics of a semiconductor wafer manufacturing process that includes collecting a quantity across each one of a first group of semiconductor wafers and scaling the collected quantity data by subtracting a pre-selected value from the measured quantity values. A principal component analysis (PCA) can be performed on the collected, scaled quantity data to produce a first set of metrics for the first group semiconductor wafers. The first set of metrics includes a first loads matrix and a first scores matrix. A first subset of significant loads can be determined from the first set of loads. The quantity data can include etch rate data.

Another embodiment includes a method for correlating a nonuniformity to a process variable includes collecting a quantity across each one of a first group of semiconductor wafers and scaling the collected quantity data. A principal component analysis (PCA) is preformed on the collected, scaled quantity data to produce a first set of metrics for the first group of semiconductor wafers. The first set of metrics include a first loads matrix and a first scores matrix. A subset of significant loads is identified from the first loads matrix. A selected process variable is changed and quantity data is collected for a second group of semiconductor wafers. The collected quantity data for the second group of semiconductor wafers is scaled. The second set of scaled data can be projected on the first subset of significant loads to identify a set of projected scores. The selected process variable can be correlated to the set of projected scores. The quantity data can include etch rate data.

Another embodiment can include a system for quantifying uniformity pattern and determining a correlation between a process variable and a nonuniformity on a semiconductor wafer. The system includes a scanning device that has the capability of measuring a quantity at multiple locations of each one of a set of wafers. A database that includes multiple process variables and the measured quantities at corresponding locations for each one of the wafers. The database is coupled to the scanning device.

A processor is also coupled to the database. A logic that determines a set of uniformity metrics of a semiconductor wafer manufacturing process for a first set of semiconductor wafer and a second set of semiconductor wafers. The system also includes a logic that correlates a nonuniformity to a process variable.

The present invention provides more specifically defined uniformity metrics that can be correlated to process variables. Correlating process variables to the uniformity metrics allows for improved troubleshooting and refinement and improvement of the semiconductor manufacturing processes.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for quantifying a nonuniformity and correlating the nonuniformity to process variables will now be described. It will be apparent to those skilled in the art that the present invention may be practiced without some or all of the specific details set forth herein.

As described above, typical prior art descriptions of nonuniformities are often subjective, indefinite and generally are very crude descriptions of the nonuniformities. One primary purpose of qualitatively and quantitatively describing nonuniformities is to provide some assistance in identifying a cause of the observed nonuniformity such as an errant process variable. Indefinite, crude and subjective metrics cannot be accurately correlated to a cause and therefore provide little direction in identifying a cause of the nonuniformity.

One embodiment uses multivariate analysis techniques to extract additional information from the etch rate data that is measured at several points on a wafer. The additional data can also be combined with expert opinion about the level of nonuniformity, which is specified for study in a particular set of experiments. Using this combination, verifiable system (e.g., etch process) improvements can be predicted. While an etch process is described as the context of the following analysis of the detected nonuniformities, it should be understood that the analysis of the nonuniformities can be used in conjunction with any semiconductor manufacturing process and is not limited to only etch processes. While the analysis herein is described in reference to an etch rate or film thickness measurements, it should be understood that the analysis of nonuniformities can be used in conjunction with any measured quantity across the wafer such as device yield or other electrical and operational parameters.

Figure 2:
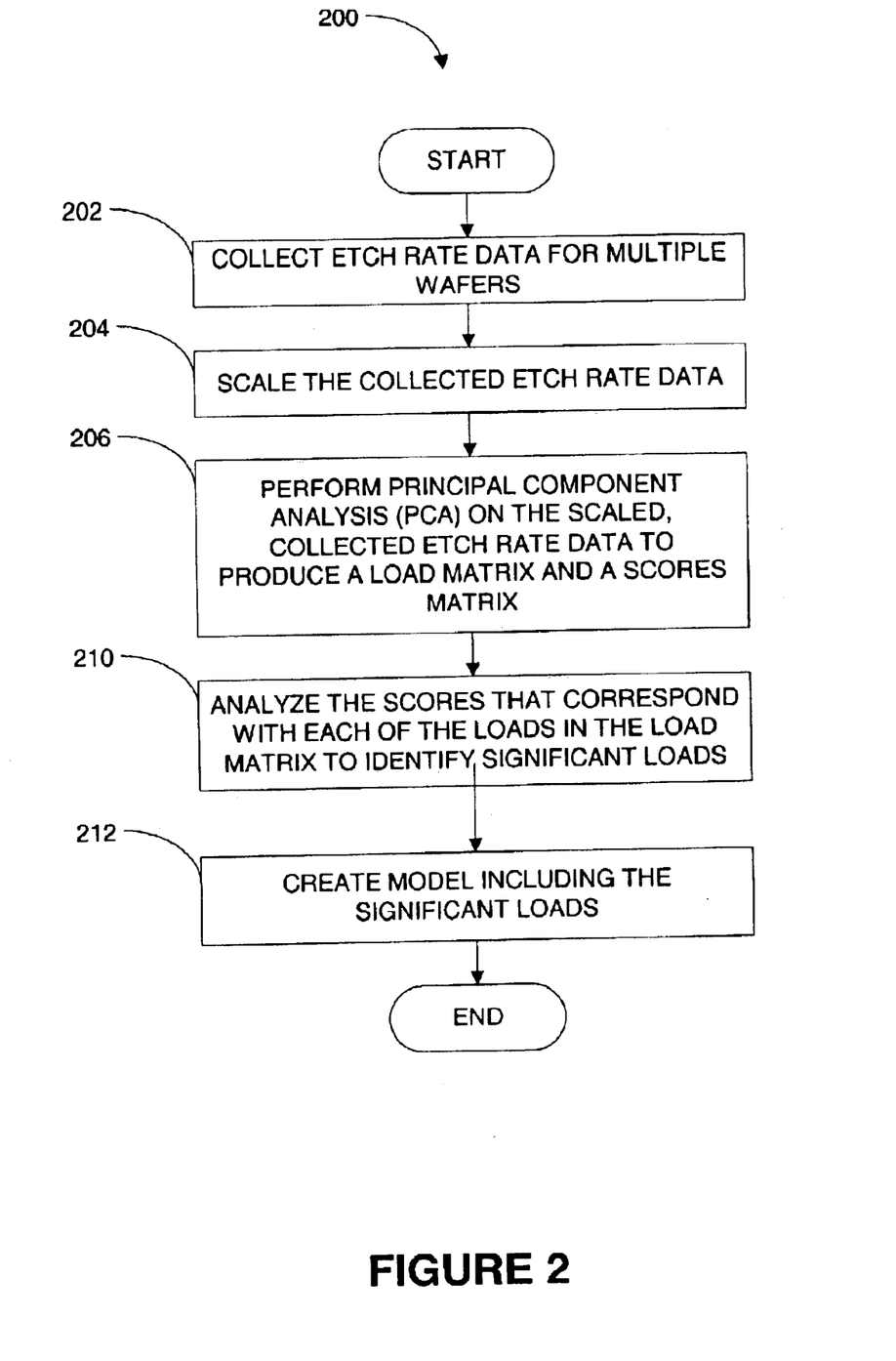
FIG. 2 shows a flow chart of the method operations for determining metrics that accurately describe a semiconductor manufacturing process in accordance with one embodiment of the present invention.

FIG. 2 shows a flow chart of the method operations 200 for determining metrics that accurately describe a semiconductor manufacturing process in accordance with one embodiment of the present invention. In operation 202, etch rate data collected for multiple wafers with nonuniformities that were output from a manufacturing process. This etch rate data can be collected through a 49-point (or more or less) scan of each of the wafers as described above, or any other suitable manner. The measured etch rates at the different points on each of the wafers are stored in a matrix form. The wafer etch rate data for each wafer is stored in a row and each column corresponds to a location of the etch rate measurement point on the corresponding wafer. Each of the multiple wafers may be from the same or different process conditions and the same or different hardware configuration.

In operation 204, the etch rate data is scaled. Scaling the measured etch rates preserves the relationships between the different measured points on the wafer. The etch rate data can be scaled by numerous methods. In one embodiment, the etch rate data is scaled by subtracting a scaling factor from each of the measured etch rates. The scaling factor can be a mean etch rate or a minimum etch rate for the corresponding individual wafer. Alternatively, an average mean etch rate or an average minimum etch rate for all of the wafers in the matrix can be selected as the scaling factor.

In operation 206, a principal component analysis (PCA) is performed on the resulting matrix of scaled etch rate data. PCA produces two matrices from the scaled etch rate data.

A first matrix is an orthonormal matrix of loads (load matrix). The load matrix includes information about the various shapes inherently present in the scaled etch rate data. A second matrix is an orthogonal matrix of scores (scores matrix). The scores matrix provides information relating how much each of the shapes that are present in the etch rate data contribute to the observed etch pattern of each wafer (i.e., the nonuniformities present on the wafer). The scores matrix and the loads matrix can be used as nonuniformity metrics that describe the measured wafers and therefore also describe the semiconductor manufacturing process that produced the wafers.

In one embodiment, a collection of wafers from the same process (i.e., same process variables) can be analyzed as described in operations 202–206 of FIG. 2. The resulting loads matrix can be used as a baseline metric for later comparison or other uses.

The loads matrix can be further refined by eliminating loads that do not have a significant number of components (i.e., insignificant loads) to provide a more refined model of the semiconductor manufacturing process that can be used as a baseline for the process. Significant loads are non-random and tend to be more helpful in identifying correlations between the metrics and the process variables.

In operation 210, scores related to each load are analyzed to identify which loads are significant and loads whose scores are above a certain level are considered significant. In operation 212, the significant loads are stored in a model that more specifically represents the semiconductor manufacturing process more than the load matrix. The model can be used for subsequent comparison and analysis of the semiconductor manufacturing process.

Figure 3:
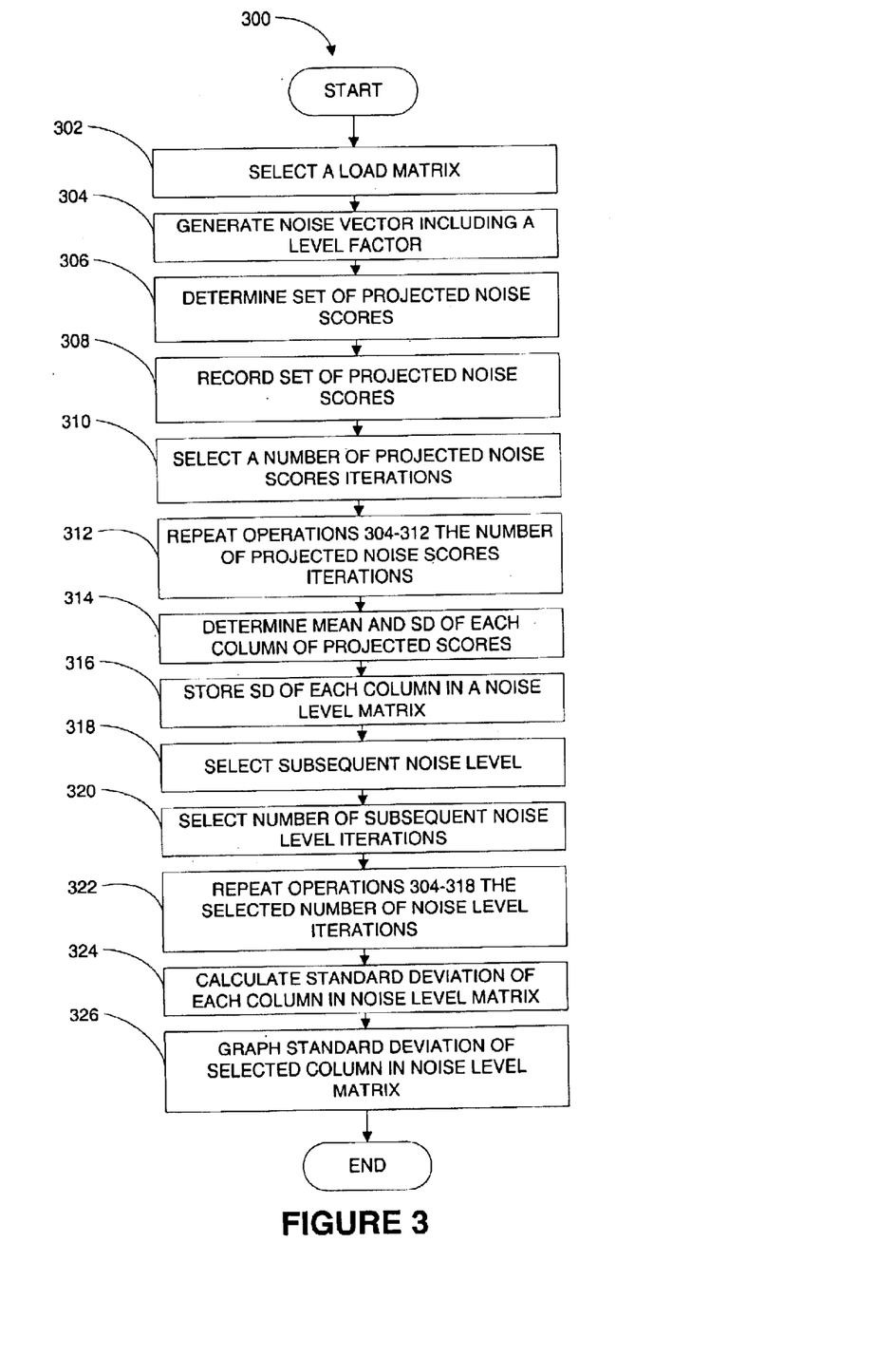
FIG. 3 is a flowchart of the method operations for determining a significant level of components, in accordance with one embodiment of the present invention.

FIG. 3 is a flowchart of the method operations 300 for determining a significant level of components, in accordance with one embodiment of the present invention. In operation 302 a load matrix, such as described in operation 206 above, from a set of wafers is selected. An abbreviated example load matrix can be as follows. The example load matrix is abbreviated as typically there are more than three

| 0.4723 | −0.6660 | 0.5430 |
| 0.3407 | 0.7420  | 0.4432 |
| 0.8130 | 0.0760  | 0.1346 |

In operation 304, a normally distributed random noise vector is generated. The random noise vector includes a level factor (level). The level factor can be whatever a user desires. In one embodiment, an engineer based on experiments and expert knowledge can predetermine the desired level factor. An example random noise vector x for a Matlab application is:

$x=(\text{level})*\text{randn}(1,3)$

Because the above example loads matrix has three columns then the resulting vector x will have three columns as follows:

$x=[-.0084\ 0.0091\ 0.0085]$

In operation 306, a set of projected noise scores are determined by projecting the noise vector onto the loads matrix resulting in a set of three projected scores, one score for each column of data in the loads matrix. Below is an example of the set of projected scores:

Projected scores=[0.0060 0.0130 0.0006]

The first set of projected scores are recorded in a projected scores matrix in operation 308. In operation 310, an iteration number of subsequent projected noise scores is selected and in operation 312, operations 304–308 are repeated the selected number of iterations to determine subsequent sets of scores. While, any number of iterations may be selected, thirty or more iterations of operations 304–308 (producing a corresponding number of sets of projected scores) provide the best results.

In operation 314, a mean and a standard deviation of each column of the projected scores matrix are determined. Because the projected scores are basically random, then the mean will typically be approximately equal to zero.

In operation 316, the standard deviation (SD) of each column of projected scores is stored as a row in a noise level matrix. An example noise level matrix follows:

Noise Level $SD_{col1}\ SD_{col2}\ SD_{col3}$

In operation 318, a subsequent noise level factor is selected. The subsequent noise level factor can be any quantity selected. In operation 320, a number of subsequent noise level iterations is selected and operations 304–316 are repeated the selected number of noise level iterations in operation 322. While any number of noise levels iterations can be selected.

If the noise level of the manufacturing process is known then the known noise level can be used and only one noise level iteration be performed (i.e. operations 316 and 318 are not required). However, if the noise level of the manufacturing process is unknown then several noise level iterations can be used to provide randomized score data to assist in identifying the random portion of the components in the loads that are attributable to the amount of noise in the manufacturing process.

Figure 4:
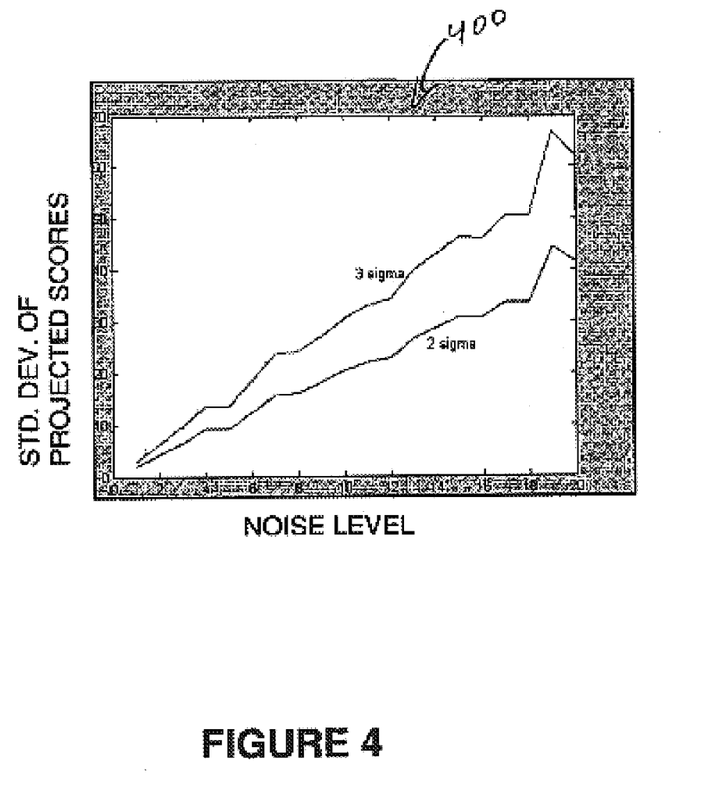
FIG. 4 is a graph of the 2-sigma and 3-sigma of the projected scores in accordance with one embodiment of the present invention.

In operation 324, a 2-sigma (2*standard deviation) or a 3-sigma (3*standard deviation) of a selected column of the projected scores for a corresponding noise level in the noise level matrix is calculated. In operation 326, the 2-sigma and/or 3-sigma is graphed as shown in FIG. 4 below. Any one of the columns of the projected scores can be selected as each column is representative of the projected scores of the corresponding noise level. For this reason a simplified embodiment of operation 314 above would include storing only a selected column of projected scores, for subsequent use.

FIG. 4 is a graph 400 of the 2-sigma and 3-sigma of the projected scores in accordance with one embodiment of the present invention. The noise level is shown on the x-axis and the standard deviation of the projected scores are shown on the y-axis. Both the 2-sigma and the 3-sigma of the projected scores are included in the graph 400 because each of the 2-sigma and the 3-sigma represent different statistical confidence levels. The 2-sigma confidence level is a 95.46% statistical confidence factor meaning that a data point that lies beyond the 2-sigma level has a 95.46% chance of not being due to a random cause. The 3-sigma confidence level is a 99.73% statistical confidence factor meaning that a data point that lies beyond the 3-sigma level has a 99.73% chance of not being due to a random cause.

In operation 322, a level of noise identified in the semiconductor process is selected to determine the significant number of scores. The noise level may be known or may be determined as described in FIG. 6. The graph 400 can be used to illustrate the significant number of components at each noise level. For example a noise level of 15 equates to a range of +/−7.5 of noise. Tracing 7.5 to the 2-sigma graph indicates that scores less than about 15 are not significant. In other words, given a noise level of 15, only loads from the loads matrix that have corresponding scores more than 15 are significant at the 2-sigma confidence level. Similarly, tracing 7.5 to the 3-sigma graph indicates that scores greater than about 25 are not significant. In other words, given a noise level of 15, only loads from the loads matrix that have more corresponding scores about than 25 are significant at the 3-sigma confidence level.

Figure 5:
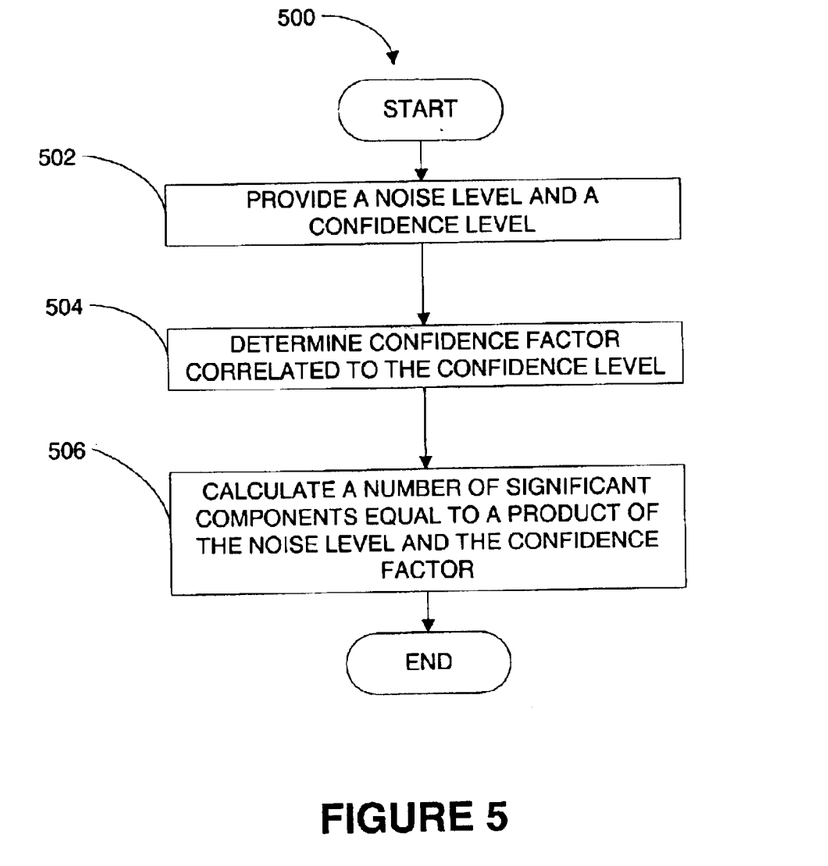
FIG. 5 is a flowchart of the method operations for determining a significant level of scores, in accordance with one embodiment of the present invention.

FIG. 5 is a flowchart of the method operations 500 for determining a significant level of scores, in accordance with one embodiment of the present invention. In operation 502 the confidence level is known and the noise level is known.

In operation 504, a confidence factor, corresponding to the confidence level is determined from a correlation table. For example, a 95.46% confidence level (approximately equivalent to a 2-sigma) is correlated to a 1.96 confidence factor in a standard normal distribution table. An example of the standard normal distribution table is published in *Applied Regression Analysis*. 2nd Edition 1981, by N. R. Draper & H. Smith, Published by John Wiley and Sons, Inc. ISBNO471-02995-5, at page 530, Normal Distribution Table.

In operation 506, the noise level is multiplied by the confidence factor to determine a significant level of non-random scores (i.e., significant level of scores). The significant level of scores corresponds to a number of significant components. For example, if the noise level is 15, then 7.5 (recall that 7.5 is equal to half the noise level because the noise level is a range centered on zero) multiplied by the 1.96 confidence factor yields a result of 14.7, which when rounded up provides a result of 15.

Figure 6:
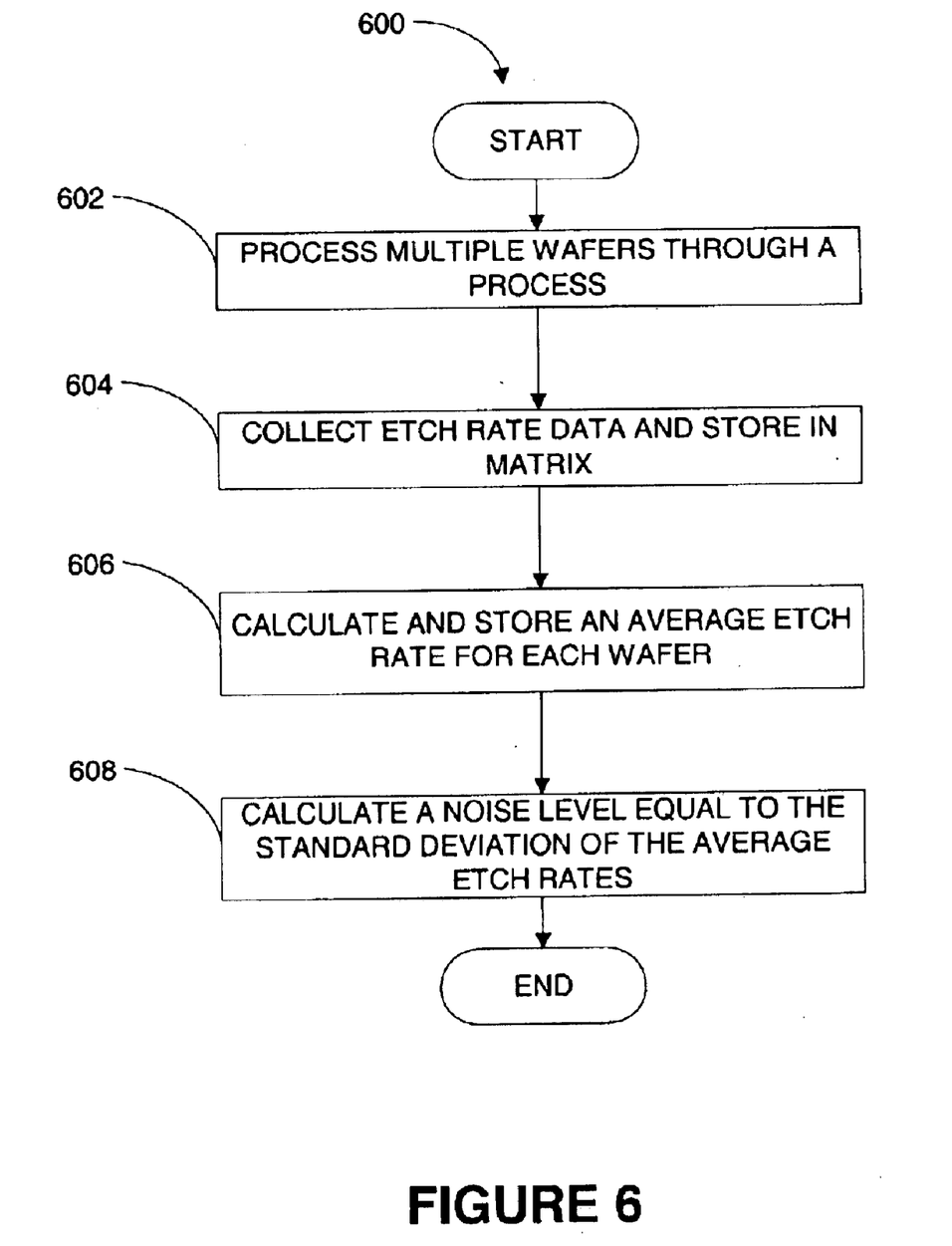
FIG. 6 is a flow chart of the method operations for determining a process noise level in a semiconductor manufacturing process in accordance with one embodiment of the present invention.

FIG. 6 is a flow chart of the method operations 600 for determining a process noise level in a semiconductor manufacturing process in accordance with one embodiment of the present invention. In an operation 602, multiple wafers are processed through the semiconductor process under the same process variable conditions. By way of example, 20 wafers are processed though the selected manufacturing process (e.g., an etch process) at the same process variable settings.

In operation 604, the etch rate data for each wafer is collected and stored in a matrix as described in FIG. 2 above. In operation 606, an average etch rate for each wafer is calculated and stored in the matrix.

A standard deviation of the stored average etch rates is determined in operation 608. The system noise is equal to the standard deviation of the stored average etch rates. If the standard deviation of the stored average etch rates is equal to 20 angstrom/minute, then 20 angstrom/minute is the noise level in the selected manufacturing process The noise level of 20 can be used as the (level) factor in operation 304 in FIG. 3 above and the noise level iterative process can be condensed to one iteration at the known (i.e. 20 angstrom/minute) noise level. Similarly, the known noise level of 20 can be used in operation 504 of FIG. 5 above also.

Figure 7:
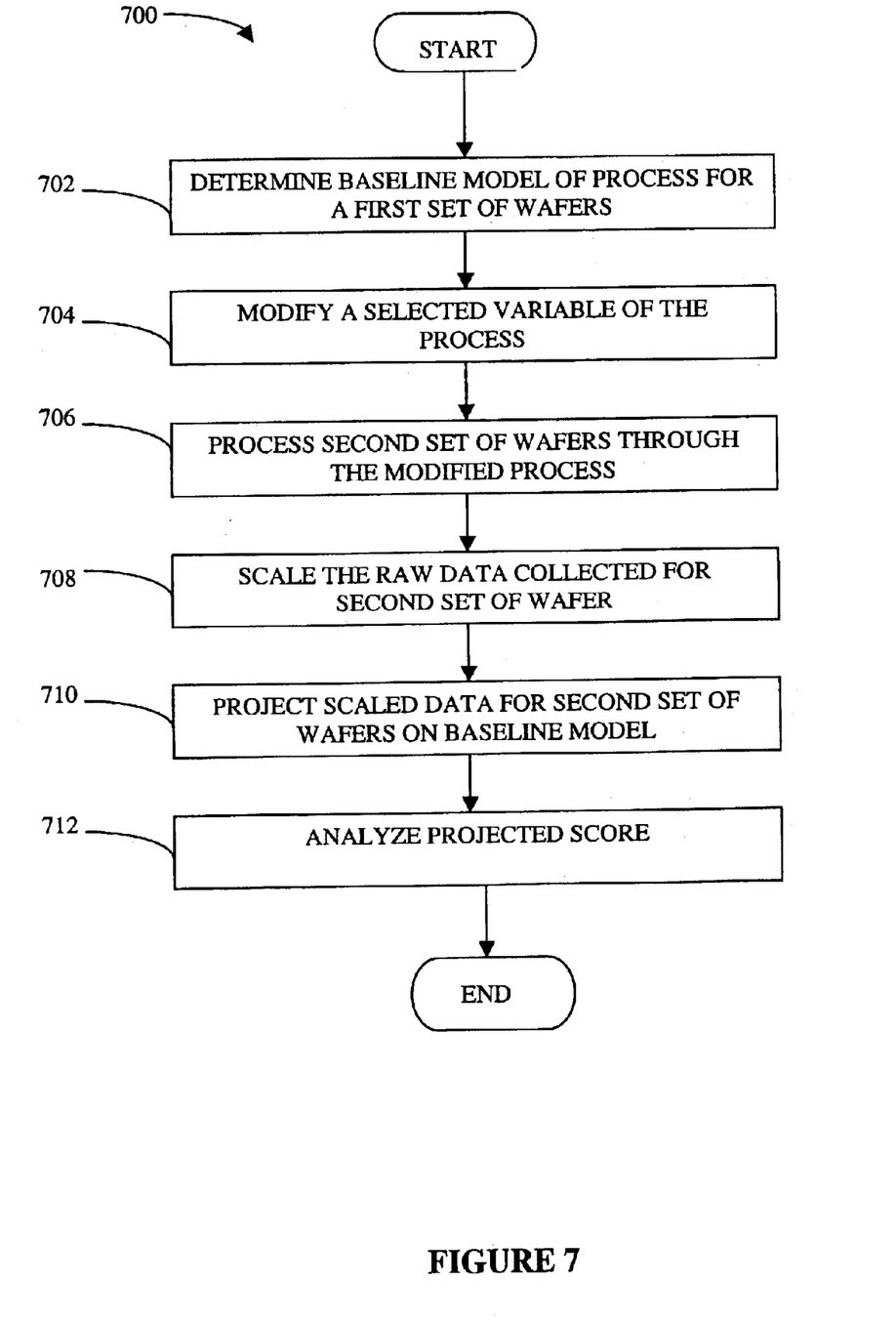
FIG. 7 is a flowchart of the method operations for correlating a process variable to a component in accordance with one embodiment of the present invention.
Figure 8:
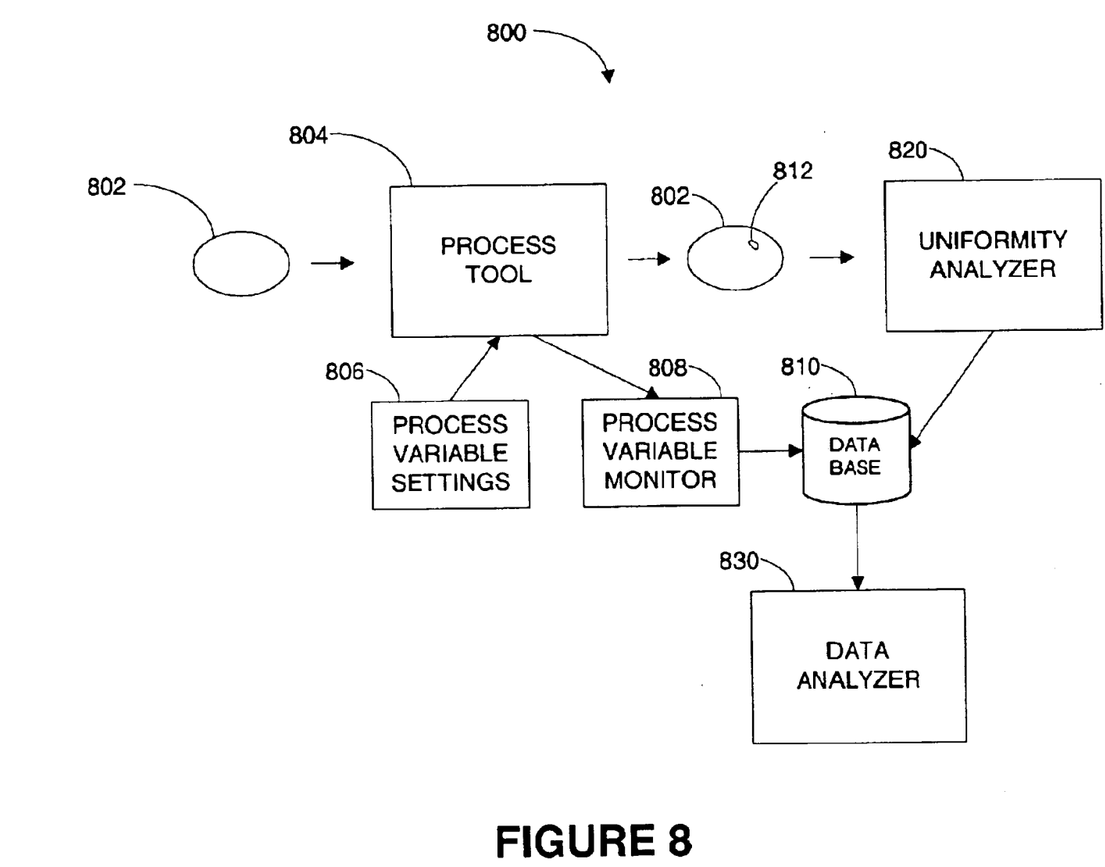
FIG. 8 is a block diagram of a system for determining causal relationships between manufacturing process variables and a nonuniformity, in accordance with one embodiment of the present invention.

FIG. 7 is a flowchart of the method operations 700 for correlating a process variable to a load in accordance with one embodiment of the present invention. FIG. 8 is a block diagram of a system 800 for determining causal relationships between manufacturing process variables and a nonuniformity, in accordance with one embodiment of the present invention. In operation 702 a baseline model of the process is determined as described in above operations 204–212 of FIG. 2. In operation 704, a selected process variable of the manufacturing process performed in operation 202 of FIG. 2 is changed. In operation 706, a second set of multiple wafers are processed through the manufacturing process. In operation 708, the raw data for the second set of wafers is scaled as described in operation 204. In operation 710, the scaled data is projected on the baseline model of the process created in operation 702. Projecting the data provides a set of projected scores. In operation 712, the projected scores can be analyzed. The projected scores can be analyzed and correlated to the process variables in the manufacturing process. Correlating the process variables to the projected scores can identify which component of nonuniformity varies with the varying process variable. The projected scores can also be analyzed to identify changes that can be identified in the form of different components that occur in the projected scores. The different components can be new or changed components. The new or changed components can be the result of a variation in the process variables, hardware changes and/or any other relevant system changes.

Additional experimentation can map accurately correlate the various process variables to the resulting components in a database. In this way, when an undesirable component is identified, the causal relationship to the process variable can be retrieved from the database so that process improvements can be predicted.

Multiple wafers 802 are input to a process tool 804 where a manufacturing process, such as etching, is applied to the wafers 802. The manufacturing process includes multiple process variables (e.g., pressures, flow rates, solutions, timing, sequencing, power and other process variables) that are applied to the wafers 802 during the manufacturing process. The manufacturing process variables are input by a controller 806 or other manner of inputting the process variables to the process tool 804.

A monitor 808 monitors the manufacturing process variables in the process tool. The monitor 808 can actually monitor the process variables occurring in the process tool 804 or alternatively, can accept the process variable set points that are output from the controller 806 or a combination thereof. The monitor 808 outputs the monitored process variable data to a database 810.

When the manufacturing process(es) within the process tool 804 are complete, the wafers 802 are output. The wafers 802 may have a nonuniformities such as nonuniformity 812 so the wafer is analyzed in a uniformity analyzer 820. The uniformity analyzer 820 can perform the operations described above in FIGS. 2–6 to characterize the wafers 802 and determine objective metrics that describe the nonuniformities 812. The uniformity analyzer 820 outputs the characterization data of the wafer and the objective metrics that describe the nonuniformity 812 to the database 810 or an alternative database (not shown).

A data analyzer 830 can be a computer either general purpose or could be purpose built to analyze the process variable data and the characterization data of the wafer and the objective metrics that describe the nonuniformity for multiple wafers. The data analyzer 830 includes logic that attempts to correlate (e.g., causal connections) common occurrences of nonuniformities and variations in one or more process variables such as described in FIG. 7 above.

As used herein in connection with the description of the invention, the term "about" means +/−10%. By way of example, the phrase "about 250" indicates a range of between 225 and 275.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can be thereafter be read by a computer system. Examples of the computer readable medium include hard drives, network attached storage (NAS), read-only memory, random-access memory, CD-ROMs, C-DRs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in FIGS. 2, 3, and 5–7 are not required to be performed in the order illustrated, and that all the processing represented by the operations may not be necessary to practice the invention. Further, the processes described in FIGS. 2, 3, and 5–7 can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for determining a plurality of uniformity metrics of a semiconductor wafer manufacturing process comprising:
    collecting a quantity across each one of a first plurality of semiconductor wafers;
    scaling the collected quantity data; and
    performing a principal component analysis (PCA) on the collected, scaled quantity data to produce a first plurality of metrics for the first plurality of semiconductor wafers, the first plurality of metrics including a first loads matrix and a first scores matrix.

2. The method of claim 1, wherein collecting the quantity across each one of the first plurality of semiconductor wafers includes:
    measuring a quantity at a plurality of locations on each one of the first plurality of semiconductor wafers; and
    storing the measured quantity values in a matrix of the first plurality of semiconductor wafers and the plurality of locations.

3. The method of claim 2, wherein scaling the collected quantity data includes subtracting a pre-selected value from the measured quantity values.

4. The method of claim 2, wherein scaling the collected quantity data includes subtracting a mean value of the measured quantity values for a selected wafer from the measured quantity values of the selected wafer.

5. The method of claim 1, wherein the first loads matrix includes a first plurality of principal components present in the collected, scaled quantity data.

6. The method of claim 5, wherein the first scores matrix includes a first plurality of scores.

7. The method of claim 6, wherein each of the first plurality of scores provides information relating a contribution magnitude for each of the plurality of principal components.

8. The method of claim 6, further comprising determining a first subset of significant loads from the first plurality of loads.

9. The method of claim 8, wherein determining the first subset of significant loads from the first plurality of loads includes:
    providing a noise level of semiconductor wafer manufacturing process;
    providing a confidence level;
    determining a confidence factor correlated to the confidence level; and
    calculating a significant level of scores equal to a product of the confidence factor and the noise level, the significant level of scores corresponding to a significant number of components; and
    identifying the first subset of significant loads as the loads from the first plurality of loads that have the significant number of components.

10. The method of claim 8, wherein determining the first subset of significant loads from the first plurality of loads includes:
    generating a noise vector;
    determining a set of projected noise scores;
    recording the set of projected noise scores;
    selecting a multiple of projected noise iterations;
    performing the selected number of projected noise iterations;
    determining a mean and standard deviation of the projected scores;
    storing standard deviation of the projected scores;
    selecting a subsequent noise level;
    selecting a multiple of subsequent noise level iterations;
    performing the selected number of subsequent noise level iterations;
    calculating standard deviation of noise level;
    graphing standard deviation of noise level;
    determining a confidence factor correlated to the confidence level; and
    calculating a significant level of scores equal to a product of the confidence factor and the noise level, the significant level of scores corresponding to a significant number of components; and
    identifying the first subset of significant loads as the loads from the first plurality of loads that have the significant number of components.

11. The method of claim 8, further comprising:
    changing a selected process variable;
    collecting a second quantity data for a second plurality of semiconductor wafers;
    scaling the collected quantity data for the second plurality of semiconductor wafers;

projecting the second quantity data on the first subset of significant loads to identify a second plurality of projected scores; and analyzing the second plurality of projected scores.

12. The method of claim 11, wherein analyzing the plurality of projected scores includes correlating the selected process variable with the second plurality of projected scores.

13. The method of claim 12, wherein correlating the selected process variable with the plurality of projected scores includes performing a product of least squares (PLS).

14. The method of claim 11, wherein analyzing the plurality of projected scores includes identifying a plurality of difference components included in the second plurality of projected scores that are not included in the first plurality of projected scores.

15. The method of claim 14, wherein the plurality of difference components include one or more new components.

16. The method of claim 1, wherein the first loads matrix is an orthonormal matrix.

17. The method of claim 1, wherein the first scores matrix is an orthogonal matrix.

18. The method of claim 1, wherein the quantity data includes etch rate data.

19. The method of claim 1, wherein substantially all of a plurality of process variables in the semiconductor wafer manufacturing process are substantially constant during a processing of the first plurality of semiconductor wafers.

20. A method for determining a plurality of uniformity metrics of a semiconductor wafer manufacturing process comprising:

collecting a quantity across each one of a first plurality of semiconductor wafers;

scaling the collected quantity data by subtracting a preselected value from the measured quantity values;

performing a principal component analysis (PCA) on the collected, scaled quantity data to produce a first plurality of metrics for the first plurality of semiconductor wafers, the first plurality of metrics including a first loads matrix and a first scores matrix; and determining a first subset of significant loads from the first plurality of loads.

21. The method of claim 20, wherein the quantity data includes etch rate data.

22. A method for correlating a nonuniformity to a process variable comprising:

collecting a first quantity across each one of a first plurality of semiconductor wafers;

scaling the collected first quantity data;

performing a principal component analysis (PCA) on the collected, scaled first quantity data to produce a first plurality of metrics for the first plurality of semiconductor wafers, the first plurality of metrics including a first loads matrix and a first scores matrix;

identifying a subset of significant loads from the first loads matrix;

changing a selected process variable;

collecting a second quantity data for a second plurality of semiconductor wafers;

scaling the collected second quantity data for the second plurality of semiconductor wafers;

projecting the second set of scaled data on the first subset of significant loads to identify a plurality of projected scores; and correlating the selected process variable with the plurality of projected scores.

23. The method of claim 22, wherein the quantity data includes etch rate data.

24. A system for quantifying uniformity pattern and determining a correlation between a process variable and a nonuniformity on a semiconductor wafer comprising:

a scanning device that has the capability of measuring a quantity at a plurality of locations of each one of a plurality of wafers;

a database that includes a plurality of process variables and the plurality of measured quantities at corresponding plurality of locations for each one of the plurality of wafers, the database coupled to the scanning device;

a processor coupled to the database;

a logic that determines a plurality of uniformity metrics of a semiconductor wafer manufacturing process for a first plurality of semiconductor wafers and a second plurality of semiconductor wafers; and a logic that correlates a nonuniformity to a process variable.

* * * * *